US010216153B2

(12) United States Patent
Batliner et al.

(10) Patent No.: US 10,216,153 B2
(45) Date of Patent: Feb. 26, 2019

(54) METHOD AND CONTROLLER FOR MODEL PREDICTIVE CONTROL OF A MULTI-PHASE DC/DC CONVERTER

(71) Applicant: AVL LIST GMBH, Graz (AT)

(72) Inventors: Martin Batliner, Eschen (LI); Oliver König, Graz (AT); Stefan Jakubek, Vienna (AT); Günter Prochart, Graz (AT)

(73) Assignee: AVL LIST GMBH, Graz (AT)

( * ) Notice: Subject to any disclaimer, the term of this patent is extended or adjusted under 35 U.S.C. 154(b) by 310 days.

(21) Appl. No.: 15/302,051

(22) PCT Filed: Mar. 3, 2015

(86) PCT No.: PCT/EP2015/054415
§ 371 (c)(1),
(2) Date: Oct. 5, 2016

(87) PCT Pub. No.: WO2015/154918
PCT Pub. Date: Oct. 15, 2015

(65) Prior Publication Data
US 2017/0227937 A1    Aug. 10, 2017

(30) Foreign Application Priority Data

Apr. 8, 2014   (AT) ................. A 50265/2014

(51) Int. Cl.
*G05B 13/04*    (2006.01)
*H02M 3/158*    (2006.01)
*G01R 31/36*    (2006.01)

(52) U.S. Cl.
CPC ....... *G05B 13/048* (2013.01); *G01R 31/3651* (2013.01); *H02M 3/158* (2013.01)

(58) Field of Classification Search
USPC ........................................................ 700/286
See application file for complete search history.

(56) References Cited

U.S. PATENT DOCUMENTS 4,961,048 A * 10/1990 Banura ............... H02M 3/158
                                                      323/272
5,023,542 A *  6/1991 Banura ............... H02M 3/158
                                                      323/284
(Continued)

FOREIGN PATENT DOCUMENTS

CN    102611890    7/2012
CN    103036460    4/2013
(Continued)

OTHER PUBLICATIONS

Beccuti et al. "Explicit Model Predictive Control of DC-DC Switched-Mode Power Supplies with Extended Kalman Filtering", Feb. 2009, IEEE Transactions on Industrial Electronics, vol. 56 issue 6 (Year: 2009).*

(Continued)

*Primary Examiner* — Jason D Mitchell
(74) *Attorney, Agent, or Firm* — Dykema Gossett PLLC (57) ABSTRACT

For an easily implementable method for model predictive control of a DC/DC converter, and a corresponding controller, with which the optimization problem of the model predictive control can also be solved sufficiently quickly with large prediction horizons, the optimization problem is divided into two optimization problems by a model predictive output variable control and a model predictive choke current control being implemented in the control unit (10), wherein: the strands of the multiphase DC/DC converter (12) for the output variable control are combined into a single strand; a time-discrete state space model is produced therefrom; and the output variable control predicts the input voltage ($u_{v,k+1}$) of the next sampling step (k+1) for this single strand on the basis of a first cost function ($J_v$) of the optimization problem of the output variable control, said input voltage being given to the choke current control as a setpoint and the choke current control determining there- (Continued)

from the necessary switch positions of the switches (S1, S2, S3, S4, S5, S6) of the strands of the multiphase DC/DC converter (12) for the next sampling step (k+1) on the basis of a second cost function ($J_i$) of the optimization problem of the choke current control.

6 Claims, 7 Drawing Sheets

(56) References Cited

U.S. PATENT DOCUMENTS

| | | | | |
|---|---|---|---|---|
| 5,754,413 | A * | 5/1998 | Fraidlin | H02M 3/33569 363/16 |
| 7,545,130 | B2 | 6/2009 | Latham | |
| 8,836,264 | B2 | 9/2014 | Geyer | |
| 2004/0179378 | A1* | 9/2004 | Tamura | H02M 3/33569 363/20 |
| 2005/0131557 | A1* | 6/2005 | Moussaoui | G05B 13/048 700/28 |
| 2005/0281061 | A1* | 12/2005 | Radecker | H02M 3/28 363/21.02 |
| 2006/0208789 | A1* | 9/2006 | Shimada | H02M 3/157 327/540 |
| 2007/0114985 | A1 | 5/2007 | Latham et al. | |
| 2010/0135046 | A1* | 6/2010 | Kurokawa | H02M 3/157 363/20 |
| 2012/0183056 | A1 | 7/2012 | He et al. | |
| 2013/0033910 | A1* | 2/2013 | Carletti | H02M 1/42 363/131 |
| 2014/0058787 | A1 | 2/2014 | Banner et al. | |
| 2014/0334207 | A1 | 11/2014 | Peyrl et al. | |
| 2015/0112620 | A1 | 4/2015 | König et al. | |
| 2015/0143885 | A1 | 5/2015 | König et al. | |
| 2015/0171726 | A1 | 6/2015 | Riar et al. | |
| 2015/0171769 | A1 | 6/2015 | Geyer | |

FOREIGN PATENT DOCUMENTS

| | | |
|---|---|---|
| CN | 103117657 | 5/2013 |
| CN | 103595069 | 2/2014 |

OTHER PUBLICATIONS

Cortes et al. "Model predictive control of cascaded H-bridge inverters based on a fast-optimization algorithm", Nov. 2015, IECON 2015—41st Annual Conference of the IEEE Industrial Electronics Society (Year: 2015).*

Kouro et al., "Model Predictive Control—A simple and powerful Method to Control Power Converters", Jun. 2009, IEEE Transaction on Industrial Electronics, vol. 56, issue 6 (Year: 2009).*

Lie et al. CN103117657 translation retrieved from Espacenet <https://worldwide.espacenet.com/> on Sep. 26, 2018 (Year: 2013).*

English Abstract of CN 103036460.

O. König et al. "Model Predictive Control of a Battery Emulator . . . Powertrains," 2011 IEEE Vehicle Power and Propulsion Conference (VPPC 2011), Chicago, Ill., USA, pp. 6-9, Sep. 2011.

Q. Jiangchao et al., "Predictive Control . . . HVDC System," IEEE Transactions on Power Delivery, vol. 27, No. 3, Jul. 2012, pp. 1538-1547.

P. Cortés et al., "Model Predictive Control . . . H-Bridge Inverters," IEEE Transactions on Industrial Electronics, vol. 57, No. 8, Aug. 2010, pp. 2691-2699.

S-K Kim et al., "A Stabilizing Model Predictive Controller . . . DC/DC Converter," 15th European Conference on Power Electronics and Applications, 2013, pp. 1-9.

English Abstract of CN102611890.
English Abstract of CN103117657.
English Abstract of CN103595069.

* cited by examiner

METHOD AND CONTROLLER FOR MODEL PREDICTIVE CONTROL OF A MULTI-PHASE DC/DC CONVERTER

The present invention relates to a method for model predictive control and a model predictive controller of a multiphase DC/DC converter having a half-bridge with two switches for each strand of the multiphase DC/DC converter, wherein the switches are controlled by a control unit in order to produce a desired output variable.

Figure 1:
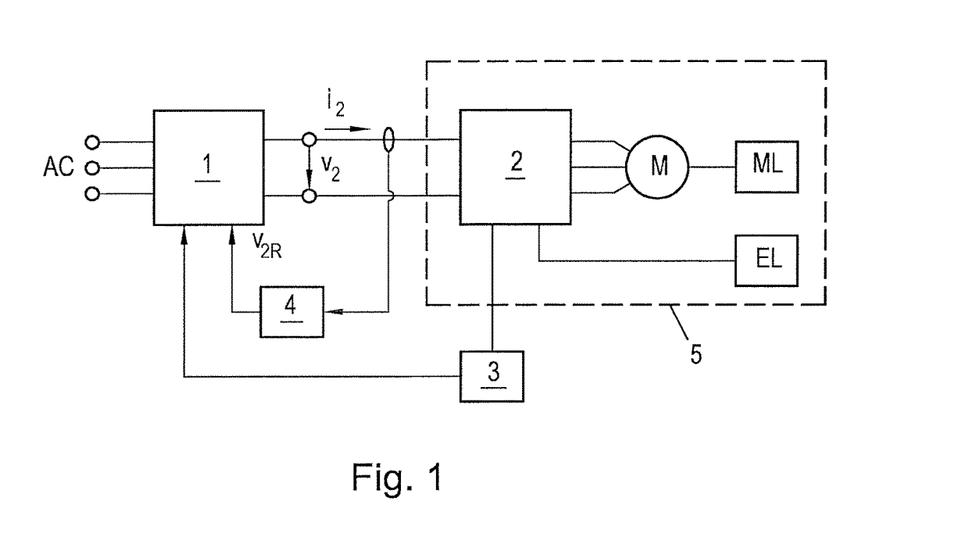
FIG. 1 illustrates a known test arrangement for testing a load with a battery emulator.

A battery emulator is a known approach for emulating the behavior of an electric battery. Such battery emulators 1 are required, for example, in the development and testing of drive trains of electric vehicles or hybrid vehicles, or for the development of electric energy storage devices of such vehicles, as indicated in FIG. 1. A battery emulator 1 generally generates a DC output voltage $v_2$ in accordance with a load current $i_2$. For this purpose, the load current $i_2$ is measured and supplied to a battery model 4 that calculates, from the load current $i_2$, a reference output voltage $v_{2R}$ that is then generated by the battery emulator 1 at the DC voltage output thereof. An arbitrary, real electrical load 5 is connected to the battery emulator 1. For example, in FIG. 1, one formed from an inverter 2 that drives an electric motor M that in turn drives a mechanical load ML (for example, a vehicle). To the inverter 2, it is also possible to connect electric loads EL, e.g., electrical components of a vehicle (for example, air conditioning, a sound system, lighting system, etc.). The battery emulator 1 and the load 5 or an inverter 5 of the load 5 can be controlled by a control unit 3, e.g., an electronic control unit (ECU) of the vehicle.

Figure 1A:
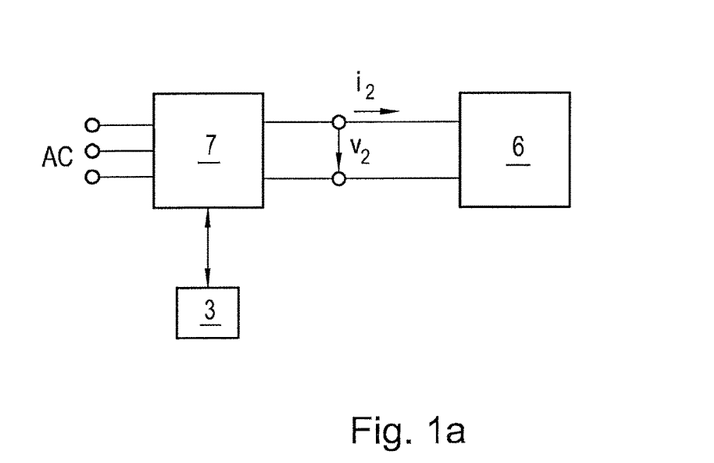
FIG. 1a illustrates a known test arrangement for testing a battery means of a battery tester.

A battery tester 7 is a known approach for charging a real electric battery 6 with a certain load, in the form of a DC load current $i_2$, as depicted in FIG. 1a. There, a certain DC output voltage $v_2$ that can be measured takes place, depending on the state of the battery 6 (SoC, SoH). To test a battery 6, for example, in the context of battery development, predetermined test runs—in the form of a predetermined time profile of the DC load current $i_2$—are performed with the battery 6. For this purpose, the battery tester 7 can be controlled by a control unit 3.

For this in the battery emulator 1 or battery tester 7 typically power electronics in the form of a DC/DC converter are implemented, by which the necessary output voltage $v_2$ (battery emulator 1) or the necessary output current $i_2$ (battery tester 7) is generated and made available. The battery emulator 1 or the battery tester 7 can, for this, be supplied from a (generally three-phase) alternating voltage source AC that is internally rectified, or from a direct voltage source. Such a battery emulator 1 is depicted by way of example in FIG. 2. With a battery tester 7, yet another additional choke $L_2$ may be arranged on the output side, otherwise the circuits will coincide, as depicted in FIG. 2a. On the input side, the three-phase alternating voltage AC is rectified in a rectifier 11 and a smoothing capacitor $C_0$ into a direct voltage $V_0$. Connected thereto are a three-phase DC/DC converter 12 have parallel half-bridges and chokes $L_a$, $L_b$, $L_c$ that are controlled each by a half-bridge, and an output-side smoothing capacitor C and/or another choke $L_2$ (with a battery tester 7). Such DC/DC converters 12 are well known and are therefore not addressed in further detail here. The switches S1 . . . S6 of the half-bridges are controlled by a control unit 10 in order to set the desired output voltage $v_2$ or the desired output current $i_2$. Generally, well-known pulse-width modulation (PWM) is provided in the control unit 10 in order to set the output voltage $v_2$ or the desired output current $i_2$ via the duty cycle of the switches. With PWM, the switches are switched once at each sampling time, given by a specific sample rate. The sampling rate is thus dependent on the allowable frequency with which the switches S1 . . . S6—generally insulated-gate bipolar transistors (IGBTs) or metal-oxide-semiconductor field-effect transistors (MOSFETs)—can be switched. The frequency with which the switches can be switched is, however, limited by the switching losses resulting from the switching. Because the PWM switches at each sampling step, this limitation also limits the sampling rate and thus also the controller bandwidth. This restriction leads to a poor dynamic of control of such converters 12 in such a manner that there can only be a slow reaction to disturbances or transient switching operations of the load 5. Though it would be possible to increase the sampling rate, in the form of oversampling, this would only be under stringent restrictions, for which reason oversampling is not practically relevant for control of the DC/DC converter 12.

In order to circumvent this drawback of a PWM, a new control strategy—the so-called finite control set model predictive control (FCS-MPC)—has already been introduced. In this control strategy, the switches S1 . . . S6 are controlled directly, for which reason PWM can be forgone. It is thus possible to also raise the sampling rate and improve the dynamics of the control. Such methods for direct control of the switches in electronic systems are not new. An overview thereof can be found in J. Rodriguez, et al., "State of the art of finite control set model predictive control in power electronics," Industrial Informatics, IEEE Transactions, 9(2):1003-1016, May 2013. In EP 2 528 225 B1, this control strategy finds, for example, use as a control for an electrical machine.

FCS-MPC is characterized by the limited number of possibilities for the manipulated variable, the so-called finite control set. For the switches S1 . . . S6 of the half-bridges of the DC/DC converter 12 in FIG. 2 or FIG. 2a, there arise 8 ($2^3$) possible switch positions that form the finite control set under the necessary condition that in each half-bridge, the two switches are never simultaneously both open or closed. Methods for model predictive control are known to be based on an optimization problem in the form of minimizing a quality function, also known as a cost function. The problem here is that a switching sequence according to the selected prediction horizon (i.e., a forecast of the future switch positions) is introduced into the quality function. This, however, causes the optimization problem to grow exponentially with the prediction horizon. A "prediction horizon" is understood to be the number of sampling steps being tracked in the future. With a prediction horizon of 1, 8 possible switch positions result in $8^1=8$ possibilities for which the cost function must be solved in order to find the optimum of these possibilities. With a prediction horizon of 5, however, there would already be $8^5=32,000$ solutions, and with a prediction horizon of 10, the solutions already number over a billion. For a targeted real-time control, however, the solution of the optimization problem must be found within a very short period of time. Sampling at a sampling rate of, for example, 20 kHz requires that there be a solution within one sampling step, i.e., within 50 µs. Even with the currently available very fast processors, it is not possible anymore to achieve this after a certain prediction horizon. But for the control of DC/DC converters with FCS-MPC, though, large prediction horizons (>10) are sought in order to reduce undesired overshooting with transient control processes, e.g., with load jumps.

WO 2013/174967 A1 discloses a model predictive control method for a battery emulator, and WO 2013/174972 A1 discloses a model predictive control method for a battery tester. Therein the method of the model predictive control is explained, and a specification of a method with which the optimization problem can be solved sufficiently quickly in order to enable sampling rates in the kHz range is provided. The DC/DC converter there, however, is again respectively controlled by means of a PWM with all of the drawbacks described above, in particular, the limited sampling rates.

The present invention addresses the problem of providing an easily implementable method for model predictive control of a DC/DC converter, and a corresponding controller, with which the optimization problem of the model predictive control can also be solved sufficiently quickly with large prediction horizons.

This problem is solved according to the present invention by dividing the optimization problem of the model predictive control into two optimization problems by a model predictive output variable controller and a model predictive choke current controller being implemented in the control unit, wherein: the strands of the multiphase DC/DC converter for the output variable controller are combined into a single strand; a time-discrete state space model is produced therefrom; the output variable controller predicts the input voltage of the next sampling step for this single strand on the basis of a first cost function of the optimization problem of the output variable controller, said input voltage being given to the choke current controller as a setpoint and the choke current controller therefrom determining the necessary switch positions of the switches of the strands of the multiphase DC/DC converter for the next sampling step on the basis of a second cost function of the optimization problem of the choke current controller. Dividing the controller into two model predictive cascaded subcontrollers—the output variable controller and the choke current controller—in accordance with the present invention makes it possible to reduce the state space model from a fourth-order model to a second-order model. This also reduces the finite control set of the model predictive control, thereby significantly reducing the solution space for the optimization problem. This is due in particular to the fact that the computational effort for the choke current control can be disregarded in comparison to the computational effort for the output variable control, since the degree of freedom of the choke current control is greatly reduced. Solutions to the optimization problem can therefore be found faster with the approach according to the present invention, thereby making it possible to also use larger prediction horizons with high sampling rates.

The possible solution space of the optimization problem can be still further significantly narrowed down if the solution space is investigated in advance in the form of an amount of possible solutions of the optimization problem of the output variable controller, and solutions that cannot occur are eliminated from the solution space. This may advantageously be performed in such a manner that a simulation is run with a predetermined control sequence of the output variable, the input vectors of the DC/DC converter occurring thereby are recorded, the input voltage of the output variable control is reconstructed from the input vectors, and the occurring sequences of the input voltage are saved as a reduced solution space.

The solution space of the optimization problem may also be significantly reduced if solutions of the optimization problem of the output variable controller are represented as an integer linear combination of basic functions, wherein the basic functions for the first sampling steps have a width of one sampling step, and the basic functions for the subsequent sampling steps have a width of an integer multiple of one sampling step.

Further limitation of the solution space can be achieved if the integer linear combinations are subject to the limitation that solutions may not switch by more than one from one sampling step to the next sampling step.

The present invention shall be described in further detail hereinbelow with reference to FIGS. 1 to 13, which illustrate advantageous embodiments of the present invention by way of example, in a schematic and non-limiting manner.

Figure 2:
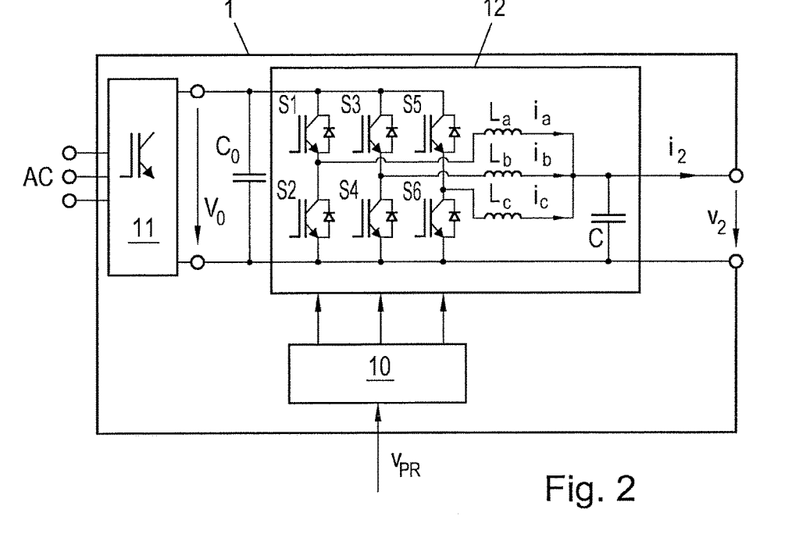
FIG. 2 illustrates the known circuit of the power electronics of a battery emulator.
Figure 2A:
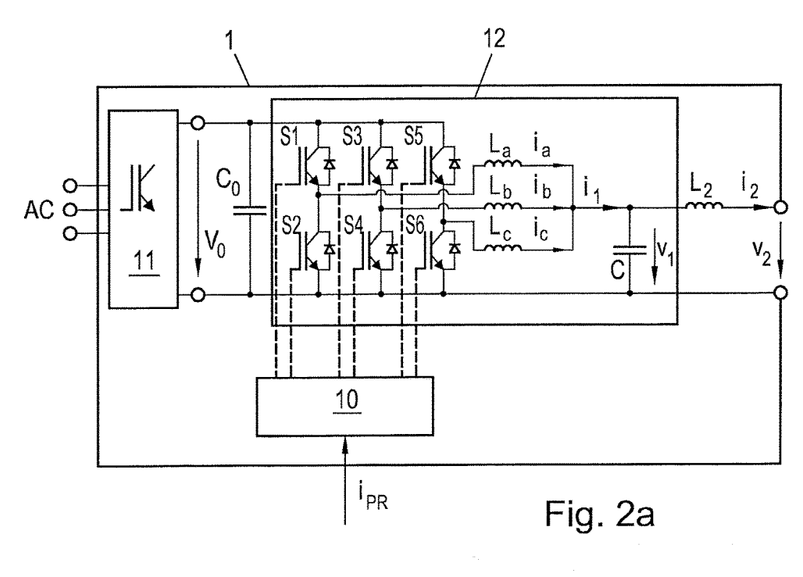
FIG. 2a illustrates the known circuit of the power electronics of a battery tester.

The starting point of the method according to the present invention is the known model of the battery emulator 1 such as shown in FIG. 2, or the known model of the battery tester 7 such as shown in FIG. 2a. The smoothing capacitor $C_O$ is assumed to be sufficiently large to be able to disregard the dynamics of the rectifier 11 and to assume that the direct voltage $V_O$ is constant. Leakage inductances of the cables and coils are also disregarded, as are non-linearities and parasitic capacities of the semiconductor switches of the half-bridges, which is allowed for normal operating conditions. The switches S1 and S2, S3 and S4, and S5 and S6 of the individual bridge branches are always switched in alternation, meaning that S1 is closed while S2 is open or vice versa, and so forth, in order to avoid a short circuit across the smoothing capacitor $C_O$. Appropriate switching of the switches S1 to S6 makes it possible to achieve positive and negative currents, i.e., a bidirectional DC/DC converter 12. It shall be readily understood that what is stated below applies also for a unidirectional DC/DC converter, with which a switch can be replaced by a diode in each half-bridge.

Although the present invention is described hereinbelow with reference to the example of a battery emulator 1, it should be noted here that the present invention can also be used in the same manner with a battery tester 7 having essentially the same circuit (see FIG. 2a). Any differences shall be discussed at the respective point in the following description.

Figure 3:
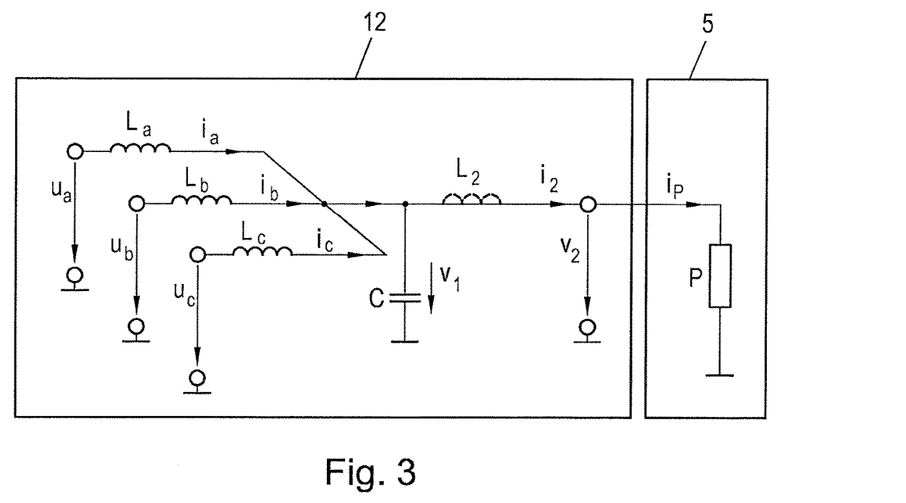
FIG. 3 illustrates a simplified electrical diagram of a DC/DC converter.

These assumptions lead to the simplified model of the battery emulator 1 or in generally a multiphase DC/DC converter 12, as depicted in FIG. 3, wherein FIG. 3, for the sake of simplicity, does not depict the ohmic resistors $R_a$, $R_b$, $R_c$ of the chokes $L_a$, $L_b$, $L_c$. FIG. 3 also indicates the commonly encountered additional output-side choke $L_2$ in a battery tester 7.

The input voltages $u_a$, $u_b$, $u_c$ of the multiphase DC/DC converter 12 are defined by $u_a = S_a V_0$, $u_b = S_b V_0$, and $u_c = S_c V_0$, wherein the signals $S_a$, $S_b$, and $S_c$ can assume eight different states, according to table 1. Consequently, the system input has eight possible states that form the finite control set.

TABLE 1

| $S_a$ | $S_b$ | $S_c$ |
|---|---|---|
| 1 | 1 | 1 |
| 1 | 1 | 0 |
| 1 | 0 | 1 |
| 1 | 0 | 0 |
| 0 | 1 | 1 |
| 0 | 1 | 0 |
| 0 | 0 | 1 |
| 0 | 0 | 0 |

The behavior of the load 5 of the DC/DC converter 12 is assumed to be unknown, because the control method shall work for a wide range of possible uses of the DC/DC converter 12. Therefore, the load 5 is assumed to be a constant-power load (CPL). The power P as a product of the load current $i_P$ and the voltage $v_2$ at the input of the load is constant, $P = i_P \cdot v_2 = \text{const}$. The power demand in the form of the power P is predetermined by the load 5. The dependency of the load current $i_P$ ($=i_2$) on the output voltage $v_2$ thus constitutes a non-linearity for the system.

An ideal voltage source may also be used as a load model, especially with a battery tester 7, wherein it would also be possible to use an impedance model or another model of the battery.

From FIG. 3, then, the state space model of the DC/DC converter 12 can be derived with the load 5. The system equations arise from the application of Kirchhoff's laws, Ohm's law, and the differential equations for an ideal capacitor and an ideal inductor on the circuit according to FIG. 3 to make $$\frac{di_a}{dt} = -\frac{R_a}{L_a}i_a - \frac{1}{L_a}v_2 + \frac{1}{L_a}u_a$$

$$\frac{di_b}{dt} = -\frac{R_b}{L_b}i_b - \frac{1}{L_b}v_2 + \frac{1}{L_b}u_b$$

$$\frac{di_c}{dt} = -\frac{R_c}{L_c}i_c - \frac{1}{L_c}v_2 + \frac{1}{L_c}u_c$$

$$\frac{du_C}{dt} = \frac{1}{C}(i_a + i_b + i_c - i_2).$$

The non-linear load current $i_P$ is linearized around a current operation point $P_0 = i_{P,0} \cdot v_{2,0}$ in the form of $$i_P \approx i_{P,0} + \left.\frac{\partial}{\partial v_2} i_P\right|_0 (v_2 - v_{2,0}) = 2 i_{P,0} - \frac{i_{P,0}}{\underbrace{v_{2,0}}_{g_P}} v_2.$$

With the state space vector $x_m = [i_a\ i_b\ i_c\ v_2]^T$, the input vector $u_m = [u_a\ u_b\ u_c]^T$, and the output vector $y_m$ with $z_m = i_{P,0}$, this leads to the continuous-time state space model $$\dot{x}_m = \underbrace{\begin{bmatrix} -\frac{R_a}{L_a} & 0 & 0 & -\frac{1}{L_a} \\ 0 & -\frac{R_b}{L_b} & 0 & -\frac{1}{L_b} \\ 0 & 0 & -\frac{R_c}{L_c} & -\frac{1}{L_c} \\ \frac{1}{C} & \frac{1}{C} & \frac{1}{C} & \frac{g_P}{C} \end{bmatrix}}_{A_m} x_m + \underbrace{\begin{bmatrix} \frac{1}{L_a} & 0 & 0 \\ 0 & \frac{1}{L_b} & 0 \\ 0 & 0 & \frac{1}{L_c} \\ 0 & 0 & 0 \end{bmatrix}}_{B_m} u_m + \underbrace{\begin{bmatrix} 0 \\ 0 \\ 0 \\ -\frac{2}{C} \end{bmatrix}}_{E_m} z_m.$$

$$y_m = \underbrace{[0\ 0\ 0\ 1]}_{C_m} x_m$$

The continuous-time state space model is transformed by discretization, by means of a zero-order hold (ZOH) with the sampling time $T_S$, into a time-discrete state space model (designated with a subscript "d") (this being well known); at the same time, the state vector is supplemented with $z_m = i_{P,0}$. The state vector $x_0$ then yields $x_o = [i_a\ i_b\ i_b\ v_2\ i_{P,0}]^T$, and the time-discrete state space model with the input vector $u_o = [u_a\ u_b\ u_c]^T$ yields $$x_{o,k+1} = \begin{bmatrix} A_{m,d} & E_{m,d} \\ 0 & 1 \end{bmatrix} x_{o,k} + \begin{bmatrix} B_{m,d} \\ 0 \end{bmatrix} u_{o,k}.$$

$$y_{o,k} = [0\ 0\ 0\ 1\ 0] x_{o,k}$$

where "k" then designates the respective sampling step.

When other load models are used, the time-discrete state space model may also deviate from the one described above, without altering the basic principle of the present invention. In particular, a time-discrete state space model can also be created in an analogous manner for the battery tester 7 according to FIG. 2a.

The model predictive control requires a cost function J that needs to be optimized. A cost function established for this purpose for the control of a DC/DC converter 12 evaluates how well the output voltage $v_2$ or the output current $i_2$ of the DC/DC converter 12 can follow a predetermined reference signal $R_s$, for example, in the form of a predetermined voltage $v_{PR}$ or a predetermined current $i_{PR}$. The cost function shall therefore primarily evaluate the deviation of the system output $Y_o = [Y_{o,k+1}\ y_{o,k+2}\ \ldots\ Y_{o,k+N_P}]^T$ from the reference signal $R_s$. The system output $y_o$ is the output voltage $v_2$ with the battery emulator 1, or the output current $i_2$ with the battery tester 7. $N_P$ designates the prediction horizon that sets forth how many time steps k in the future are being counted. Furthermore, the switching losses from when the switches S1 . . . S6 are switched should be evaluated. It is also advantageous to ensure that the phase currents $i_a$, $i_b$, $i_c$ of the multiphase DC/DC converter 12 are equal, to the greatest extent possible, in order to prevent excessively high strand currents from flowing through the individual strands, which could damage the hardware. A cost function J is therefore formulated in the form of $J=(R_s-Y_o)^T(R_s-Y_o)+\lambda_s \cdot T^T T+\lambda_B \cdot \Delta C^2$.

Therein, the term $(R_s-Y_o)^T(R_s-Y_o)$ evaluates the deviation of the system output $Y_o$ from the reference signal. The switching losses are evaluated with the term $\lambda_s \cdot T^T T$, wherein $T=[t_k\ t_{k+1}\ \ldots\ t_{k+Np-1}]^T$ with $t_k=|u_{a,k}-u_{a,k-1}|+|u_{b,k}-u_{b,k-1}|+|u_{c,k}-u_{c,k-1}|$ evaluates the frequency of switching operations of the switches S1 . . . S6 by penalizing the difference between an input variable and the input variable from the previous time step. The weighting factor $\lambda_s$, with which this term is weighted in the cost function J, yields an additional tuning parameter for the control. With the term $\lambda_B \cdot \Delta C^2$, the deviation of the strand currents to one another is evaluated, with $$\Delta C = \sum_{k=1}^{N_P} \max(i_{a,k}, i_{b,k}, i_{c,k}) - \min(i_{a,k}, i_{b,k}, i_{c,k}).$$

Thus, the deviation between the maximum strand current and the minimum strand current is penalized. $\lambda_B$ is, in turn, a weighting factor that gives an additional tuning parameter to the control. Alternatively, it would also be possible to apply $$\Delta C = \sum_{k=1}^{N_P} (i_{a,k}-i_{b,k})^2 + (i_{b,k}-i_{c,k})^2 + (i_{c,k}-i_{a,k})^2.$$

The weighting factor $\lambda_s$ affects the undulation of the output voltage $v_2$/the output current $i_2$ as well as the switching frequency of the converter 12. The higher the weighting factor $\lambda_s$, the greater the undulation and the lower the switching frequency. With the weighting factor $\lambda_B$, the width of the band within which the strand currents vary is affected.

It shall be readily understood that a weighting factor may also be employed for the first term in the above cost function J. The cost function may also include other or additional terms, in order to evaluate certain other or additional aspects.

The model predictive control can also take boundary conditions into account, which represents a particular strength of the model predictive control. An important boundary condition for protecting the converter 12 and preventing saturation of the chokes $L_a$, $L_b$, $L_c$ is a limitation of the strand currents $i_a$, $i_b$, $i_c$, for example, in the form of $i_{min} \leq i_a+i_b+i_c \leq i_{max}$. The boundary condition may be taken into account by, for example, indefinitely setting the solution of the cost function J to the value if a boundary condition is violated.

With a conventional model predictive control, this cost function J would now be minimized for all of the possible combinations of the input vector $u_o=[u_a\ u_b\ u_c]^T$ for the prediction horizon $N_P$ by taking the boundary condition into account. This results in the input variables $u_{o,k+1}$, $u_{o,k+2}$, $u_{o,k+Nc}$ for the next time steps, wherein $N_C$ designates the control horizon, which is often equal to the prediction horizon $N_P$. According to the principle of the receding horizon, only the first control process $u_{o,k+1}$ is applied at any point in time, and the rest is discarded. This is repeated for each time step. This basic principle of a model predictive control is well known, and therefore is not described in any further detail here.

Figure 4:
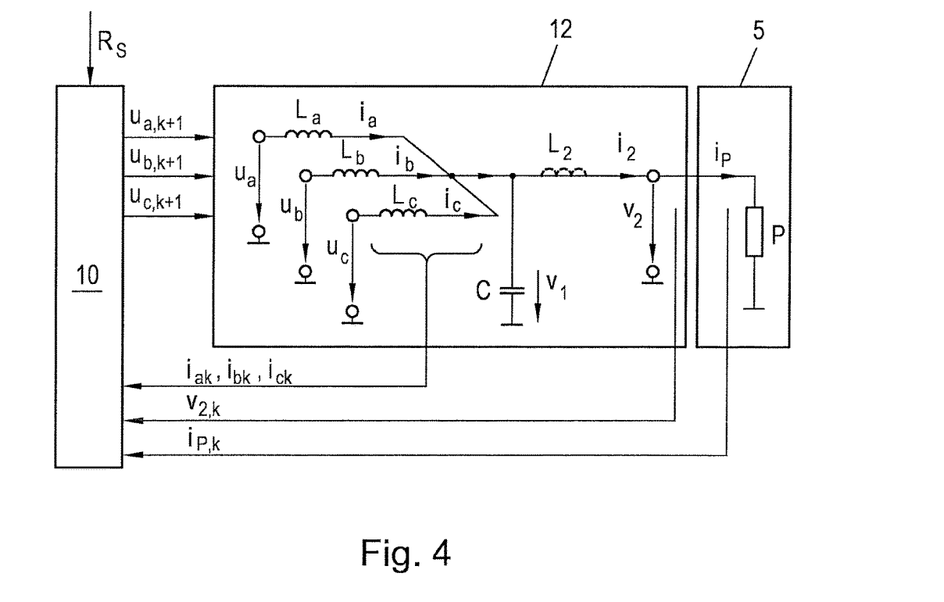
FIG. 4 illustrates a model predictive control of a DC/DC converter according to the present invention.

The model predictive control may be explained as illustrated in FIG. 4. The current strand currents $i_{a,k}$, $i_{b,k}$, $i_{c,k}$, the current output voltage $v_{2,k}$ (or the output current $i_{2,k}$ in the case of a battery tester 7), and the current load current $i_{P,k}$ are measured and supplied to the control unit 10. Therein, the cost function J is minimized, as explained above, and the input vector $u_{o,k+1}=[u_{a,k+1}\ u_{b,k+1}\ u_{c,k+1}]^T$ determined directly yields the required switch positions for the switches S1 . . . S6, which are then switched accordingly in the next time step.

As already noted, however, the optimization of the cost function J necessitates calculation of a large number of possible combinations of consecutive input vectors $u_{o,k}$, which requires a considerable amount of computing time. In the present example, a prediction horizon of $N_P=10$ would entail $8^{10}=1.073.741.824$ possible combinations. The number of possible combinations is meant to be significantly reduced by the methods according to the present invention described hereinbelow.

Figure 5:
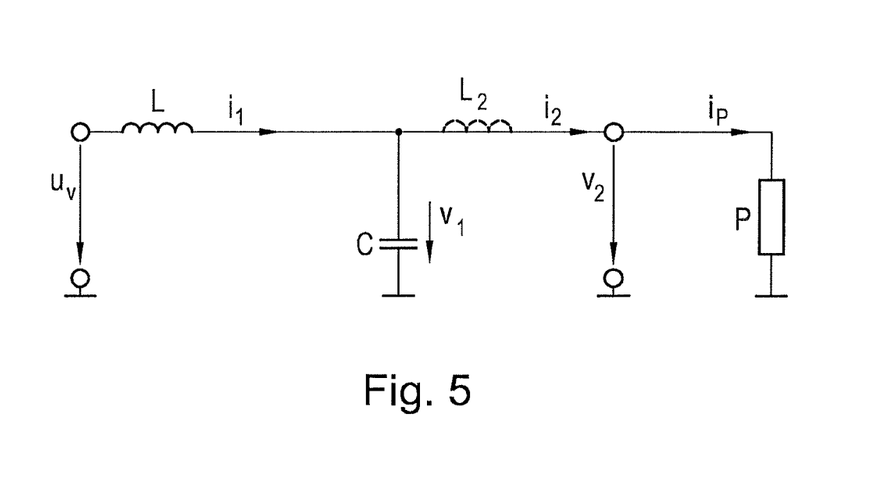
FIG. 5 illustrates an electrical model equivalent circuit diagram of the output variable control of the DC/DC converter.
Figure 6:
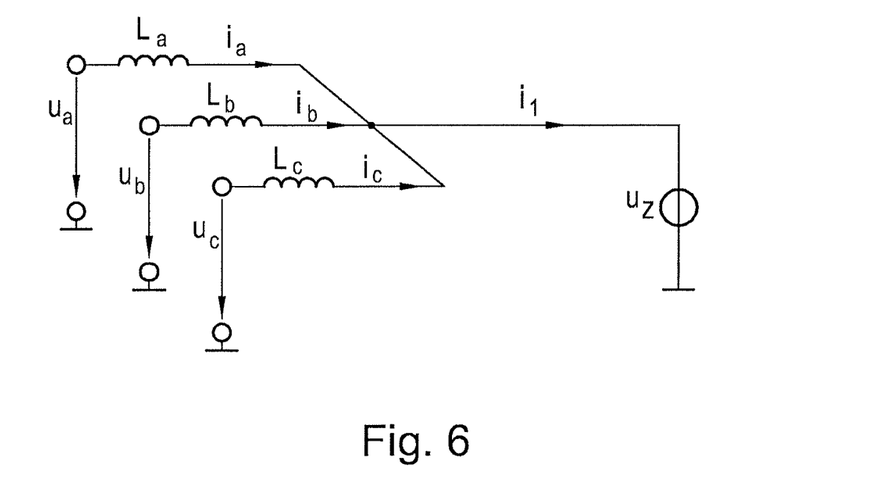
FIG. 6 illustrates an electrical equivalent circuit diagram of the choke current control of the DC/DC converter.

For this purpose, the control of the DC/DC converter 12 is divided into an output variable control—namely, a voltage control of the output voltage $u_2$ in the case of a battery emulator 1 (FIG. 5) or a current control of the output current $i_2$ in the case of a battery tester 7—and a choke current control (FIG. 6).

For the output variable control, the inductances of the chokes $L_a$, $L_b$, $L_c$ of the individual strands of the DC/DC converter 12 are combined into one inductance $L=L_a/3=L_b/3=L_c/3$ (under the permissible assumption of identical chokes) (FIG. 5). The current $i_1$ is the sum of the individual choke currents, $i_1=i_a+i_b+i_c$. The individual resistances $R_a$, $R_b$, $R_c$ (not shown) are likewise combined into one resistance $R=R_a/3=R_b/3=R_c/3$ (under the permissible assumption of identical resistances). The fourth-order model of FIG. 3 is thereby reduced to a second-order model according to FIG. 5; at the same time, the possible inputs are also limited according to the possible switch positions to the input voltage of the output variable control $u_v=\{0, V_0/3, 2V_0/3, V_0\}$. The finite control set of the output variable control is thus composed of only four elements. Analogously, as described in FIG. 3, the time-discrete state space model is also obtained in the form $$x_{v,k+1} = \underbrace{\begin{bmatrix} A_{U,d} & E_{U,d} \\ 0 & 1 \end{bmatrix}}_{A_v} x_{v,k} + \underbrace{\begin{bmatrix} B_{U,d} \\ 0 \end{bmatrix}}_{B_v} u_v$$

$$y_v = \underbrace{[0\ 1\ 0]}_{C_v} x_v$$

with the state vector $x_v=[i_1\ v_2\ i_{P,0}]^T$. To do so, a cost function $J_v$ is established, in which the deviation of the system output from a reference signal $R_s$ and the switching rate are again evaluated. One term $(R_s-Y_v)^T(R_s-Y_v)$, with $Y_v=[y_{v,k+1}\ y_{v,k+2}\ \ldots\ y_{v,k+Np}]^T$, evaluates the deviation, and one term $\lambda_v \cdot (T_{v,k}-T_{v,k-1})^T(T_{v,k}-T_{v,k-1})$, with $T_{v,k}=[u_{v,k}\ u_{v,k+1}\ \ldots\ u_{v,k+Np-1}]^T$, penalizes the change of two temporally successive input variables (input voltage $u_v$ of the output variable control), wherein the weighting factor $\lambda_v$ is again a tuning parameter for the control. The cost function then yields $J_v=(R_s-Y_v)^T(R_s-Y_v)+\lambda_v \cdot (T_{v,k}-T_{v,k-1})^T(T_{v,k}-T_{v,k-1})$. The boundary condition gives $i_{min} \leq i_1 \leq i_{max}$, analogously to the above.

With a battery tester 7 with current control, the state vector would be $x_v=[i_1\ v_1\ i_2\ v_2]^T$, and a time-discrete state space model and a cost function $J_v$ are analogously obtained.

Because the finite control set for the output variable control is composed of only four elements, only $4^{N_P}$ more possible combinations arise for the solution of the optimization problem. Thus, a prediction horizon of $N_P$=10 produces only $4^{10}$=1,048,576 more possible combinations, i.e., fewer than in FIG. 3 by a factor of 1,000.

The choke current control according to FIG. 6 provides, inter alia, the state variable $i_1=i_a+i_b+i_c$ that is required by the output variable control. Analogously to the description above with reference to FIG. 3, the individual strand currents $i_a$, $i_b$, $i_c$ should then again be kept within a narrow range, and excessively large deviations between the individual strand currents should be avoided. The system model of the choke current control may therefore, as illustrated in FIG. 6, be formed of the three strands of the DC/DC converter 12 and an ideal voltage source $u_z$. The behavior of the other state variables is already predicted by the output variable control. For this reason, in each sampling step k, the predicted voltage at the capacitor C is assigned to the ideal voltage source $u_z$, i.e., $u_z=v_2$.

With the state vector $x_i=[i_a\ i_b\ i_c\ u_z]^T$ and the input vector $u_i=[u_a\ u_b\ u_c]^T$, the continuous-time state space model of the choke current control according to FIG. 6 gives $$\dot{x}_i = \underbrace{\begin{bmatrix} -\frac{R_a}{L_a} & 0 & 0 & -\frac{1}{L_a} \\ 0 & -\frac{R_b}{L_b} & 0 & -\frac{1}{L_b} \\ 0 & 0 & -\frac{R_c}{L_c} & -\frac{1}{L_c} \\ 0 & 0 & 0 & 0 \end{bmatrix}}_{A_i} x_i + \underbrace{\begin{bmatrix} \frac{1}{L_a} & 0 & 0 \\ 0 & \frac{1}{L_b} & 0 \\ 0 & 0 & \frac{1}{L_c} \\ 0 & 0 & 0 \end{bmatrix}}_{B_i} u_i.$$

$$y_i = \underbrace{[1\ 1\ 1\ 0]}_{C_i} x_i$$

The continuous-time state space model is in turn discretized. In order for it to be possible to meet the output variable control $i_1=i_a+i_b+i_c$, the condition $u_v=\frac{1}{3}(u_a+u_b+u_c)$ must be fulfilled, as can be shown by simple derivation. This arises from the precondition $L=L_a/3=L_b/3=L_c/3$. Analogously to FIG. 3, a cost function $J_i$ that evaluates the switching rate and the equality of the strand currents is established.

$$J_i = \lambda_i \cdot T^T T + \lambda_B \cdot \Delta C^2$$

$$\frac{1}{3}(u_{a,k} + u_{b,k} + u_{c,k}) = u_{v,k}$$

applies as a secondary condition, wherein $u_{v,k}$ is predetermined by the output variable control as a predicted voltage of the next sampling step k+1. Due to this secondary condition, the choke current controller always delivers the required current.

The choke current control obtains the predicted next input voltage $u_{v,k+1}$ of the output variable control as a setpoint, and calculates from this setpoint the actual input to the system in the form of the input vector $u_i=[u_a\ u_b\ u_c]^T$. The choke current control thus determines the switch positions of the switches S1 . . . S6 for the next sampling step k+1. A prediction horizon of $N_P$ of 1 suffices for the subordinate choke current control. However, the choke current control must follow the output variable control, i.e., when the latter outputs 0 or $3 \cdot V_0/3$, the choke current control must output [0 0 0] or [1 1 1]. For $1 \cdot V_0/3$ or $2 \cdot V_0/3$, this results in at most three remaining possibilities (for example, [1 1 0], [0 1 1] and [1 0 1] for $2 \cdot V_0/3$). The degree of freedom of the choke current control is set thereby. The choke current control distributes the setpoint of the output variable control to the strands of the multiphase DC/DC converter 12.

The optimum voltage vector $u_{i,k}$ that directly delivers the switch positions of the switches S1 . . . S6 of the multiphase DC/DC converter 12 is determined within the degree of freedom of the choke current control, through the solution of the optimization problem with the cost function $J_i$. If all or none of the strands of the multiphase DC/DC converter 12 is/are switched, then no optimization is needed and $u_i=[V_0\ V_0\ V_0]$ or $u_i=[0\ 0\ 0]$ will be applied. Should only one or two of the strands be switched, then the result is three respective different possible switch combinations. For example, if one strand is switched, it follows that $u_i=[V_0\ 0\ 0]$, $u_i=[0\ V_0\ 0]$ or $u_i=[0\ 0\ V_0]$.

The advantage now arises from the optimization problem being divided into two separate optimization problems, wherein the optimization problem for the choke current control is negligible for the performance. Simulations have confirmed that for each arbitrary prediction horizon $N_P$ of the output variable control, it suffices to have a prediction horizon of $N_P$=1 for the choke current control. This means that for the desired solution of the optimization problem of the choke current control, at most three possible combinations must be investigated. It is thus possible to disregard the computational effort for the choke current control, relative to the computational effort of the output variable control.

Only $4^{N_P}$ possible combinations thus arise for the solution of the optimization problem for the output variable control and the choke current control.

Figure 7:
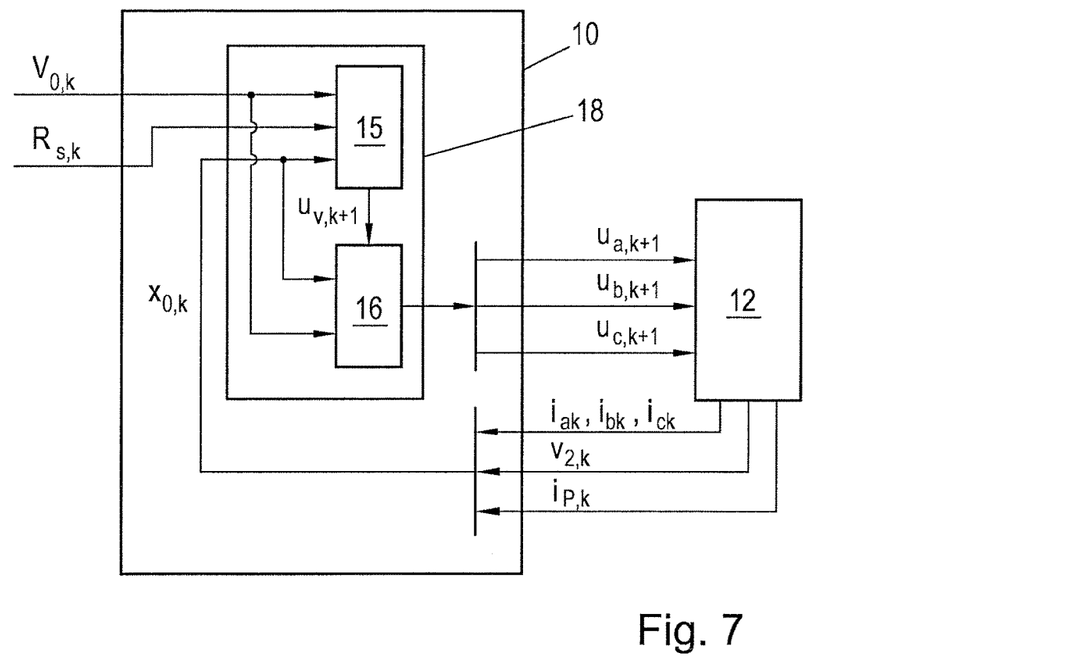
FIG. 7 illustrates a control scheme according to the present invention for a battery emulator.

FIG. 7 depicts a block diagram of the resulting control scheme, on the basis of the example of a battery emulator 1. The controller 18 comprising the output variable controller 15 for the output variable control 15 and the choke current controller 16 for the choke current control are implemented in the control unit 10. As input, the output variable controller 15 receives the direct voltage $V_0$ and the reference signal $R_s$ that the DC/DC converter 12 is to track at the output. The current state variables $x_{o,k}$ i.e., strand currents $i_{a,k}$, $i_{b,k}$, $i_{c,k}$, output voltage $v_{2,k}$, and load current $i_{P,k}$—are measured and supplied to the control unit 10. The input voltages $u_{a,k+1}$, $u_{b,k+1}$, $u_{c,k+1}$, to be applied for the next sampling step k+1, or the switch positions of the switches S1 . . . S6, are determined therefrom and applied to the DC/DC converter 12.

Figure 8:
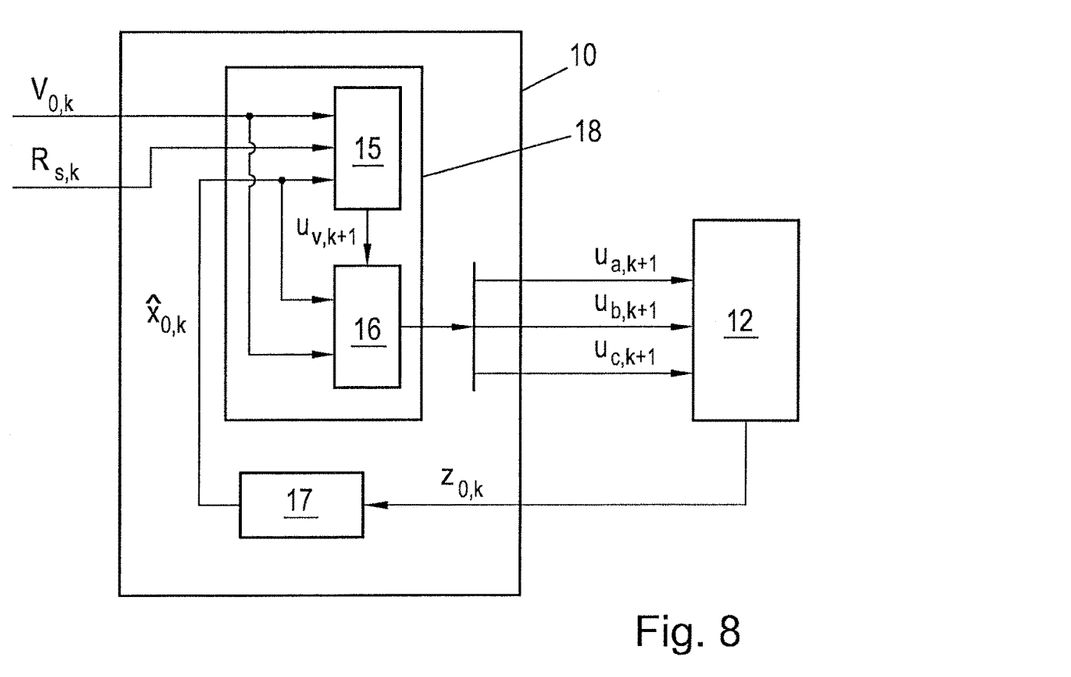
FIG. 8 illustrates a control scheme according to the present invention for a battery emulator having an observer.

If the state vector x cannot be measured at all or can only be partially measured, then it would be possible to also implement a regulatory observer 17, e.g., in the form of a Kalman filter, in order to estimate the required state vector $\hat{x}_{o,k}$ from the measured variables $z_{o,k}$, as depicted in FIG. 8. Being well known, such observers and the design thereof are not explained in further detail here.

Figure 9:
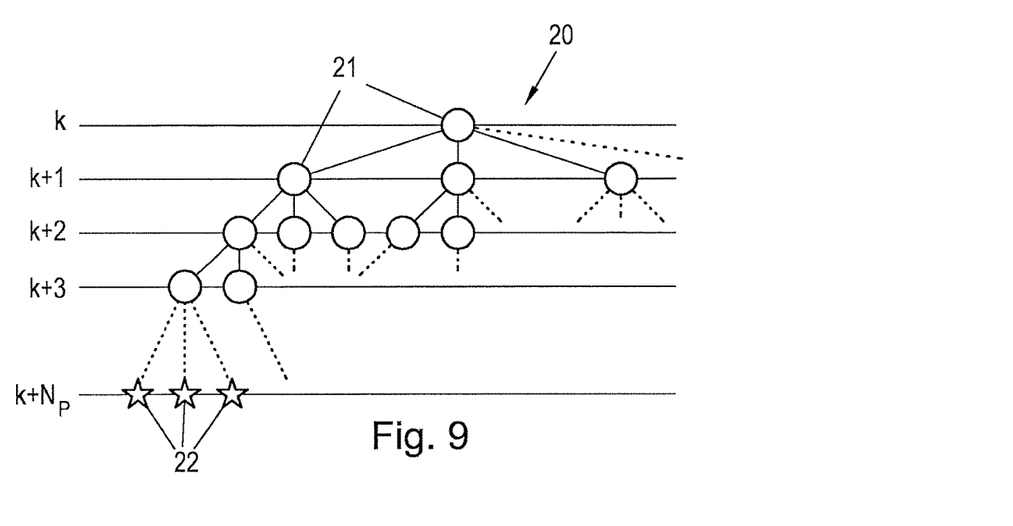
FIG. 9 illustrates the representation of the solutions of the optimization problem as a search tree.

The solutions of the optimization problem can also be represented as a search tree 20 with nodes 21 and leaves 22 and with a depth corresponding to the prediction horizon $N_p$, as depicted in FIG. 9. Each leaf 22 of the search tree 20 represents a solution of the optimization problem. The search tree 20 can now be searched through completely in order to solve the optimization problem. However, it would also be possible to use tree search algorithms in order to more rapidly reach the solution of the optimization problem. One possible algorithm would be, for example, a known branch and bound algorithm. Therewith, the set of possible solutions is divided into subsets, and suboptimal solutions are recognized and discarded by means of bounds. The worst case here, too, is to deal with a complete search through the search tree 20. Since the algorithm is well known, a more detailed description is forgone here.

The number of possible solutions from $4^{N_P}$ can be even further reduced by attempting to reduce the possible solution space (i.e., the leaves 22 of the search tree 20) before searching through the search tree 20. Knowledge of the underlying optimization problem can be put to use here.

The vast majority of possible solutions of the optimization problem are never even used. This is because the controller in the control unit 10 penalizes the switches between states in the cost functions $J_i$ and $J_v$, in order to keep the switching frequency low. The controller in the control unit 10 thus does not cause a switching process of the switches S1 to S6 at every point in time. There do, however, arise possibilities for limiting the number of possible solutions—the solution space.

Figure 10A:
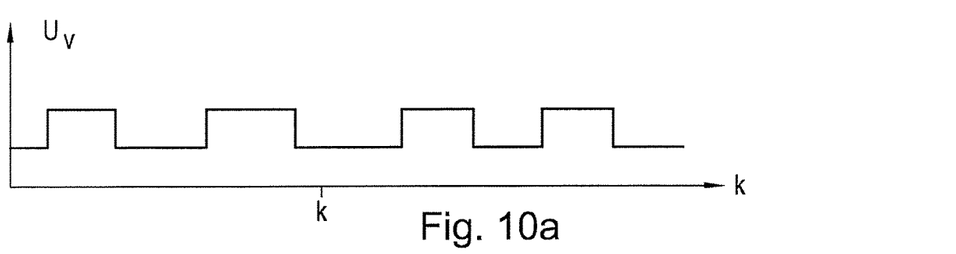
FIG. 10b illustrates the activation of the switch of the half-bridge of the DC/DC converter by the choke current control at a predetermined input (FIG. 10a)
Figure 10B:
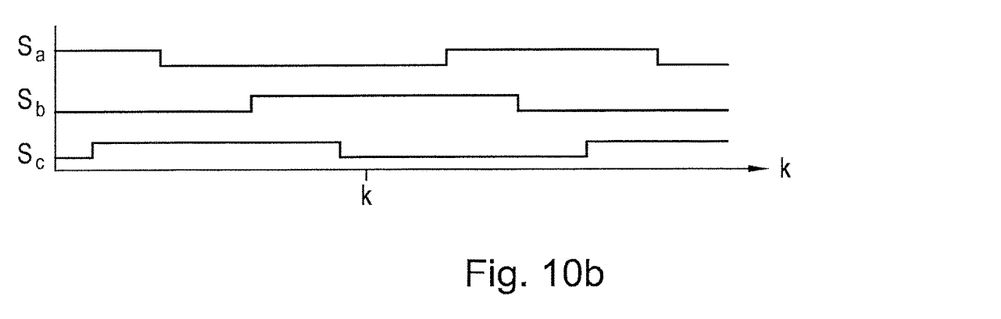

Penalization of switching processes in the cost functions makes it possible for the resulting input signal in the stationary operation to appear, for example, as represented in FIG. 10. FIG. 10a shows what is predetermined by the output variable control, and FIG. 10b shows how the choke current control activates or deactivates the switches S1 . . . S6 in a manner appropriate therefor. If, now, in a first method for solution space reduction (hereinafter called a principle pattern (PP)), a snapshot of the subsequent $N_P$ (prediction horizon) sampling steps $k+N_P$ is made for any arbitrary point in time k, and the same is done for all further points in time, then it is discovered that the different sequences that occur for the input voltage $u_v$ of the output variable control are far fewer in number than the $4^{N_P}$ possibilities.

These sequences can be saved and combined, and predetermined for the control unit 10 as a reduced solution space (a search tree 20 with fewer leaves 22). The number of possible solutions is thereby greatly restricted. The above-mentioned tree search algorithms thus need only search through a much smaller, rather shattered search tree 20. Here, ideally, all of the remaining leaves 22 of the search tree 20 are searched through, because it would take too long to prepare the branch and bound algorithm (overhead).

The same is analogously true for a battery tester 7 with the output current $i_2$ as the output variable.

Figure 11:
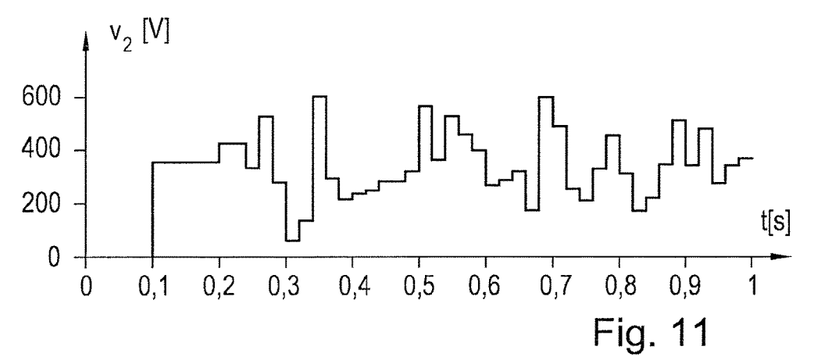
FIG. 11 illustrates an exemplary control sequence for the DC/DC converter.

In order to now reach these sequences, it is possible to run a simulation with a control sequence for the output variable (the output voltage $v_2$ in the case of the battery emulator 1, as in FIG. 11, or the output current $i_2$ in the case of the battery tester 7), which reproduces essentially all of the relevant operation points of the DC/DC converter 12. Such a control sequence is depicted by way of example in FIG. 11. The associated input vectors $u_i=[u_a\ u_b\ u_c]^T$ of the DC/DC converter 12 are recorded, and the input $u_v$ of the output variable control is reconstructed therefrom. These sequences can be extracted thereby.

Figure 12:
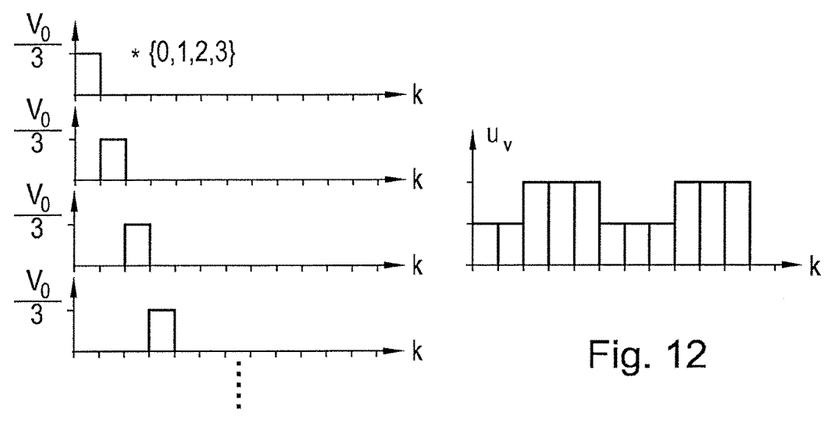
FIGS. 12 and 13 illustrate a method according to the present invention for solution space reduction of the optimization problem.
Figure 13:
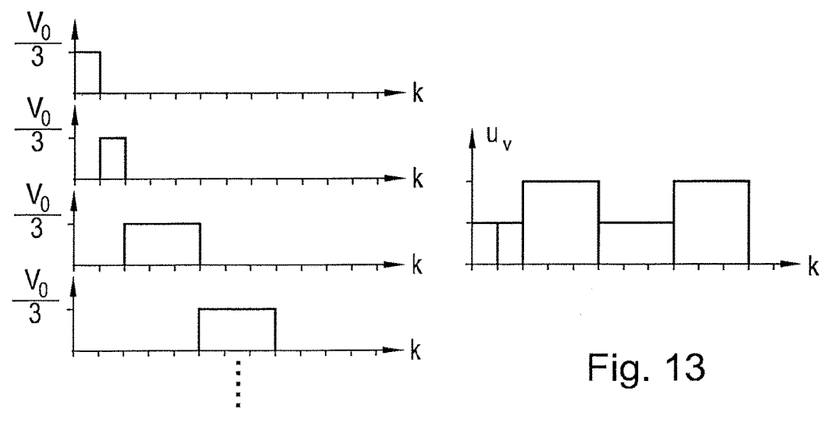

A second method for solution space reduction (called constraint basis functions (CBFs) hereinafter) is based on cutting up the solution space. The entire solution space that was considered previously has a basis such as is depicted in FIG. 12, or, put another way, $$u_v = \frac{V_0}{3} u_{int}$$

with $u_{int}=\{0, 1, 2, 3\}$. Each solution represents an integer linear combination of this basic function. Because the controller in the control unit 10 typically does not switch at every sampling step k—see, for example, FIG. 10—another basis can be selected, such as is depicted, for example, in FIG. 13. The controller in the control unit 10 has full freedom for the first two sampling steps, and is more roughly resolved later in time, here in the form of basic functions with a width of three sampling steps. The solution space is now limited to the integer linear combination of these basic functions.

It shall be readily understood that other basic functions than those depicted may be used, provided that the solution space is reduced thereby. For example, it would be conceivable to make the temporal resolution ever rougher for ever rougher prediction horizons.

It is also possible to introduce the restriction that the solutions may not switch by more than one from one sampling step to the next, e.g., $1 \cdot V_0/3$ to $2 \cdot V_0/3$, but not to $3 \cdot V_0/3$. This leads to further reduction of the solution space, by multiple orders of magnitude. For implementation, all of these solutions can be precalculated, and made available to the control unit 10 as a possible solution space. For this purpose, all of the possible linear combinations are evaluated offline, and those that violate the above restriction are eliminated. The remaining linear combinations are then made available to the online algorithm as a reduced search space. This reduced solution space can now be passed over to a tree search algorithm in order to most effectively search through the reduced search tree 20. Due to the structure of the resulting search tree 20, the branch and bound algorithm works very well here.

The same is analogously true for a battery tester 7 with the output current $i_2$ as the output variable.

Table 2 shows the effect of the above-described methods for reducing the solution space of the optimization problem. Here it is apparent that the number of possible solutions for the optimization problem can be massively reduced with the above methods, making it also possible to calculate large prediction horizons $N_P$ in real time.

TABLE 2

| $N_P$ | $8^{N_P}$ | $4^{N_P}$ | PP | CBF |
| --- | --- | --- | --- | --- |
| 1 | 8 | 4 | 4 | 4 |
| 2 | 64 | 16 | 14 | 10 |
| 3 | 512 | 64 | 33 | 26 |
| 4 | 4,096 | 256 | 48 | 26 |
| 5 | 32,768 | 1,024 | 67 | 26 |
| 6 | 262,144 | 4,096 | 81 | 68 |
| 7 | 2,097,152 | 16,384 | 116 | 68 |
| 8 | 16,777,216 | 65,536 | 178 | 68 |
| 9 | 134,217,728 | 262,144 | 237 | 178 |
| 10 | 1,073,741,824 | 1,048,576 | 313 | 178 |
| 11 | 8,589,934,592 | 4,194,304 | 489 | 178 |

The method according to the present invention makes it possible to take large prediction horizons $N_P$ into account for the controller 18 in the control unit 10, whereby the controller 18 is better able to react to transient processes, and able to react more quickly and with less overshoot to such processes. This is supported by the higher sampling rate that is made possible.

The method according to the present invention has been described with reference to a multiphase DC/DC converter 12 with three strands. However, it shall be readily understood that the method can also be transferred to a DC/DC converter 12 with fewer or more strands.

The invention claimed is:

1. A method for model predictive control of a multiphase DC/DC converter (12) having a half-bridge having two switches (S1, S2, S3, S4, S5, S6) for each strand of the multiphase DC/DC converter (12), wherein the switches (S1, S2, S3, S4, S5, S6) are controlled by a control unit (10) in order to produce a desired output variable ($v_2$, $i_2$), characterized in that: the optimization problem of the model predictive control is divided into two optimization problems by a model predictive output variable control and a model predictive choke current control being implemented in the control unit (10), wherein: the strands of the multiphase DC/DC converter (12) for the output variable control are combined into a single strand; a time-discrete state space model is produced therefrom and the output variable control predicts the input voltage ($u_{v,k+1}$) of the next sampling step (k+1) for this single strand on the basis of a first cost function ($J_v$) of the optimization problem of the output variable control, said input voltage being given to the choke current control as a setpoint and the choke current control determining therefrom the necessary switch positions of the switches (S1, S2, S3, S4, S5, S6) of the strands of the multiphase DC/DC converter (12) for the next sampling step (k+1) on the basis of a second cost function ($J_i$) of the optimization problem of the choke current control.

2. The method according to claim 1, characterized in that: a solution space is investigated in advance in the form of an amount of possible solutions of the optimization problem of the output variable control, and solutions that cannot occur are eliminated from the solution space, in order to reduce the size of the solution space.

3. The method according to claim 2, characterized in that: a simulation is run with a predetermined control sequence of the output variable ($v_2$, $i_2$), the input vectors ($u_i$) of the DC/DC converter (12) occurring thereby are recorded, the input voltages ($u_v$) of the output variable control are reconstructed from the input vectors ($u_i$), and the occurring sequences of the input voltage ($u_v$) are saved as a reduced solution space.

4. The method according to claim 1, characterized in that: solutions of the optimization problem of the output variable control are represented as an integer linear combination of basic functions, wherein the basic functions for the first n sampling steps (k+n) have a width of one sampling step (k), and the basic functions for the subsequent sampling steps (k+m), where m>n, have a width of an integer multiple of one sampling step (k).

5. The method according to claim 4, characterized in that: the integer linear combinations are subject to the limitation that solutions may not switch by more than one from one sampling step (k) to the next sampling step (k+1).

6. A model predictive controller of a multiphase DC/DC converter (12) having a half-bridge having two switches (S1, S2, S3, S4, S5, S6) for each strand of the multiphase DC/DC converter (12), and having a control unit (10) that controls the switches (S1, S2, S3, S4, S5, S6) in order to produce a desired output variable ($v_2$, $i_2$), characterized in that: a model predictive output variable controller (15) and a model predictive choke current controller (16) are provided in the controller (18); wherein: the strands of the multiphase DC/DC converter (12) for the output variable controller (15) are combined into a single strand, in order to produce a time-discrete state space model; the output variable controller (15) predicts the input voltage ($u_{v,k+1}$) of the next sampling step (k+1) for this single strand on the basis of a first cost function ($J_v$) of the optimization problem of the output variable controller (15); and the choke current control (16) determines, from the predicted input voltage ($u_{v,k+1}$), the necessary switch positions of the switches (S1, S2, S3, S4, S5, S6) of the strands of the multiphase DC/DC converter (12) for the next sampling step (k+1) on the basis of a second cost function ($J_i$) of the optimization problem of the choke current controller (16); and in that: the control unit (10) sets the determined switch positions for the DC/DC converter (12) in the next sampling step (k+1).

* * * * *